(12) United States Patent
Salem

(10) Patent No.: US 12,635,118 B2
(45) Date of Patent: May 19, 2026

(54) EMF SHIELD

(71) Applicant: SWITCH PROJECT LLC, Woodland Hills, CA (US)

(72) Inventor: Ben Salem, Woodland Hills, CA (US)

(73) Assignee: SWITCH PROJECT LLC, Woodland Hills, CA (US)

( * ) Notice: Subject to any disclaimer, the term of this patent is extended or adjusted under 35 U.S.C. 154(b) by 104 days.

(21) Appl. No.: 18/885,655

(22) Filed: Sep. 15, 2024

(65) Prior Publication Data

US 2025/0008716 A1     Jan. 2, 2025

Related U.S. Application Data

(63) Continuation of application No. 18/701,347, filed as application No. PCT/US2022/040975 on Aug. 20, 2022, now Pat. No. 12,133,371.

(60) Provisional application No. 63/256,559, filed on Oct. 16, 2021, provisional application No. 63/256,350, filed on Oct. 15, 2021.

(51) Int. Cl.
*H05K 9/00*          (2006.01)
(52) U.S. Cl.
CPC .................................. *H05K 9/0088* (2013.01)
(58) Field of Classification Search
CPC ..................................................... H05K 9/0088
See application file for complete search history.

(56) References Cited

U.S. PATENT DOCUMENTS

| | | | | |
|---|---|---|---|---|
| 6,768,654 B2 * | 7/2004 | Arnold | .............. | B29C 45/14811 |
| | | | | 361/752 |
| 7,129,422 B2 * | 10/2006 | Arnold | .................. | H10W 76/47 |
| | | | | 174/394 |
| 10,596,780 B2 * | 3/2020 | Seo | ....................... | H05K 9/0022 |
| 2014/0220335 A1 * | 8/2014 | Lin | ....................... | H05K 9/0084 |
| | | | | 428/327 |
| 2019/0339432 A1 | 11/2019 | Du | | |
| 2024/0314992 A1 * | 9/2024 | Daghighian | ......... | H05K 9/0088 |

* cited by examiner

*Primary Examiner* — Hung V Ngo
(74) *Attorney, Agent, or Firm* — CP LAW GROUP PC; Cy Bates

(57) ABSTRACT

An EMF shield is disclosed. The EMF shield includes a scattering layer and a reflective layer having an exterior surface and an interior surface opposite the exterior surface. The scattering layer includes a metal coating disposed at the exterior surface. The reflective layer includes a first side and a second side opposite the first side, the first side of the reflective layer being coupled to the interior surface of the scattering layer, wherein the reflective layer comprises a dielectric material. The metal coating includes an adhesive coating for coupling to an electronic device. The EMF shield is configured to scatter and reflect the EMF signal. After the EMF signal is initially scattered by the metal coating, the reflective layer causes the EMF signal to reflect.

20 Claims, 8 Drawing Sheets

300

310

320

330

EMF SHIELD

CROSS-REFERENCE TO RELATED APPLICATIONS

This application claims benefit of priority with U.S. Provisional Application Ser. No. 63/256,350, filed Oct. 15, 2021; this application further claims benefit of priority with U.S. Provisional Application Ser. No. 63/256,559 filed Oct. 16, 2021; the entire contents of each are hereby incorporated by reference.

TECHNICAL FIELD

This invention relates to EMF shields; more particularly, EMF shields configured to scatter, disperse, and reflect an EMF signal.

BACKGROUND ART

The World Health Organization has classified radiofrequency electromagnetic field (EMF) signals as possibly carcinogenic to humans (Group 2B). Negative health effects due to EMF signals are only increased when devices such as wireless earbuds, virtual reality headsets, and wearable computer glasses are held in close proximity to a user's head for a prolonged period of time while constantly emitting EMF signals.

SUMMARY OF INVENTION

Technical Problem

Conventional EMF shields exist which either reflects or absorbs the EMF signal. However, shields which purely reflect the EMF signal usually redirect the signal back to the user, or alternatively to others nearby. Many reflective shields that are commercially available provide little to no SAR reduction to the user.

EMF shields which are designed to absorb and trap the EMF signal are less desirable due to the shield containing the EMF signal in close proximity to the user's head for an extended period of time. Maintaining the absorbed EMF signal when in close proximity to the user's head can also cause significant negative health effects. Furthermore, energy absorbed by an EMF shield increases in temperature and can cause irritation to the user wearing the EMF shield in close proximity to the user's skin.

Solution to Problem

An EMF shield is disclosed. The EMF shield comprises a scattering layer and a reflective layer having an exterior surface and an interior surface opposite the exterior surface. The scattering layer includes a metal coating disposed at the exterior surface. The reflective layer includes a first side and a second side opposite the first side, the first side of the reflective layer being coupled to the interior surface of the scattering layer, wherein the reflective layer comprises a dielectric material. The metal coating includes an adhesive coating for coupling to an electronic device.

The EMF shield is configured to scatter and reflect the EMF signal as opposed to purely reflecting or absorbing the signal. Based on position of the scattering layer and the reflective layer, the EMF signal will initially contact the scattering layer prior to contacting the reflective layer. The metal coating initially causes the EMF signal to disperse and scatter. The scattered EMF signal has a lower energy density and therefore becomes less harmful as compared to the initial, more concentrated signal. After the EMF signal is initially scattered by the metal coating, the reflective layer causes the EMF signal to reflect.

Advantageous Effects of Invention

By reflecting the already scattered signal, the EMF signal is more easily broken up. Harmful signals are not sent back to the user or others as is done by conventional reflection shields.

Further, harmful signals are not absorbed and retained in near proximity to users as is done by conventional absorption shields. This can be especially dangerous with newer electronics which are designed to be in constant close proximity to a user's head or face such as VR headsets, wireless earbuds, wearable computer glasses, and the like.

The EMF shield comprises little to no absorption and therefore does not increase in temperature and irritate the user's skin.

BRIEF DESCRIPTION OF THE DRAWINGS

Other features, combinations, and embodiments will be appreciated by one having the ordinary level of skill in the art of antennas and accessories upon a thorough review of the following details and descriptions, particularly when reviewed in conjunction with the drawings, wherein.

DETAILED DESCRIPTION

Figure 1:
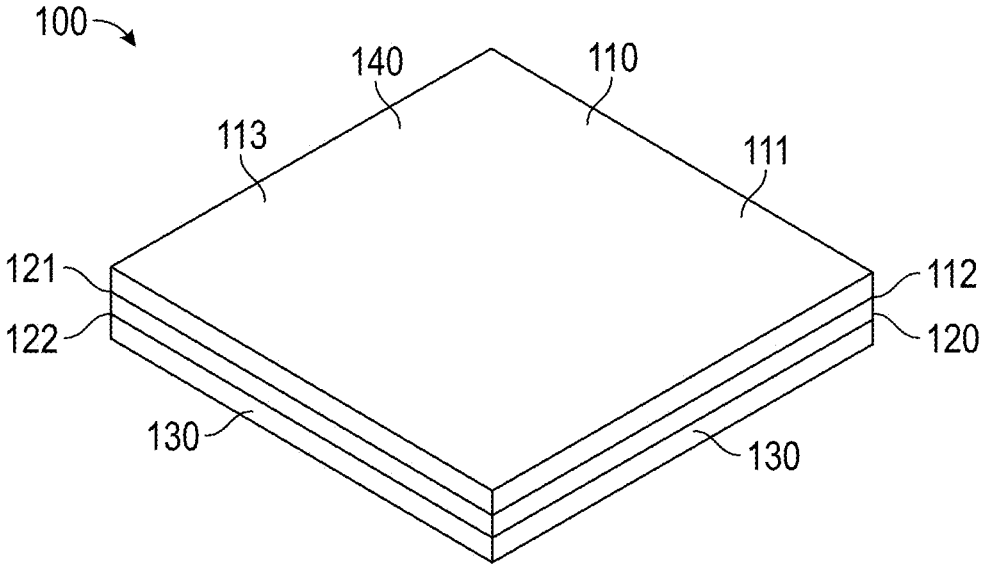
FIG. 1 shows a perspective view of an EMF shield in accordance with a first illustrated embodiment.

For purposes of explanation and not limitation, details and descriptions of certain preferred embodiments are hereinafter provided such that one having ordinary skill in the art may be enabled to make and use the invention. These details and descriptions are representative only of certain preferred embodiments, however, a myriad of other embodiments which will not be expressly described will be readily understood by one having skill in the art upon a thorough review of the instant disclosure. Accordingly, any reviewer of the instant disclosure should interpret the scope of the invention only by the claims, as such scope is not intended to be limited by the embodiments described and illustrated herein.

For purposes herein, the term "opaque" means a material which allows no light to pass through.

The term "EMF-absorbing material" means materials known to absorb an EMF signal including silver-nickel, carbon-steel, zinc, graphite, or other materials known to one having skill in the art to absorb EMF signals.

Unless explicitly defined herein, terms are to be construed in accordance with the plain and ordinary meaning as would be appreciated by one having skill in the art.

General Description of Embodiments

In one embodiment, an EMF shield is disclosed. The EMF shield comprises a scattering layer having an exterior surface and an interior surface opposite the exterior surface, the scattering layer comprising a metal coating disposed at the exterior surface, a reflective layer having a first side and a second side opposite the first side, the first side of the reflective layer coupled to the interior surface of the scattering layer, wherein the reflective layer comprises a dielectric material, and an adhesive coating coupled to the metal coating.

In some embodiments, the scattering layer may further comprise a dielectric substrate disposed between the metal coating and the reflective layer. The dielectric substrate may comprise a thermoplastic polymer. The thermoplastic polymer may comprise polyester.

In some embodiments, the scattering layer may be opaque.

In some embodiments, the scattering may comprise metallized polyethylene terephthalate (PET).

In some embodiments, the metal coating may comprise aluminum.

In some embodiments, the metal coating may comprise a holographic pattern. The holographic pattern may comprise a prism-style holographic pattern.

In some embodiments, the dielectric material may comprise a thermoplastic polymer. The thermoplastic polymer may comprise polyester. The thermoplastic polymer may comprise polyethylene terephthalate.

In some embodiments, the reflective layer may be opaque.

In some embodiments, the EMF shield may further comprise a protective layer coupled to the second side of the reflective layer. The protective layer may comprise a thermoplastic polymer. The thermoplastic polymer may comprise biaxially-oriented polypropylene In some embodiments, the scattering layer and the reflective layer may each be devoid of EMF-absorbing material.

In a second embodiment, an EMF-reduced system is disclosed. The EMF-reduced system comprises a wireless earbud and an EMF shield. The wireless earbud comprises an earbud portion coupled to a stem portion, the stem portion having a stem-inner surface and a stem-outer surface opposite the stem-inner surface. The EMF shield is coupled to the stem-inner surface. The EMF shield comprises a scattering layer having an exterior surface and an interior surface opposite the exterior surface, the scattering layer comprising a metal coating disposed at the exterior surface, a reflective layer having a first side and a second side opposite the first side, the first side of the reflective layer coupled to the interior surface of the scattering layer, wherein the reflective layer comprises a dielectric material, and an adhesive coating coupled to the metal coating.

In some embodiments, at least a portion of the stem-outer surface may be uncovered by the EMF shield.

In a third embodiment, an EMF-reduced system is disclosed. The EMF-reduced system comprises a wearing computer glasses and an EMF shield. The wearable computer glasses comprise lens disposed within a rim, a first temple coupled to the rim at a first end piece, the first temple including a first temple tip, and a second temple coupled to the rim at a second end piece, the second temple including a second temple tip. The EMF shield is coupled to an inner surface of the first temple, the EMF shield comprises a scattering layer having an exterior surface and an interior surface opposite the exterior surface, the scattering layer comprising a metal coating disposed at the exterior surface, a reflective layer having a first side and a second side opposite the first side, the first side of the reflective layer coupled to the interior surface of the scattering layer, wherein the reflective layer comprises a dielectric material, and an adhesive coating coupled to the metal coating.

In some embodiments, the EMF shield may be disposed between the first end piece and the first temple tip.

In some embodiments, the EMF-reduced system may further comprise a secondary EMF shield coupled to an inner surface of the second temple.

In a fourth embodiment, an EMF-reduced system is disclosed. The EMF-reduced system comprises a virtual reality headset and an EMF shield. The virtual reality headset comprises a housing with a facial-interfacing surface, the facial interfacing surface including a first lens, a second lens, a forehead portion disposed above the first and second lens, a first temple portion disposed to a side of the first lens, a second temple portion disposed to the side of the second lens, and a nose portion disposed between the first and second lens. The EMF shield is coupled to the forehead portion. The EMF shield comprises a scattering layer having an exterior surface and an interior surface opposite the exterior surface, the scattering layer comprising a metal coating disposed at the exterior surface, a reflective layer having a first side and a second side opposite the first side, the first side of the reflective layer coupled to the interior surface of the scattering layer, wherein the reflective layer comprises a dielectric material, and an adhesive coating coupled to the metal coating.

In some embodiments, the EMF shield may extend beyond each of the first lens and the second lens.

In some embodiments, the EMF shield may comprise a plurality of shield portions.

Manufacturing

The scattering layer may comprise metallized polyethylene terephthalate (PET) wherein the metallized PET comprises a dielectric substrate being PET and a metal coating disposed on one side of the PET substrate, such as aluminum. Thickness of the PET substrate may be 0.04 mm. Other thicknesses may also be utilized. Thickness of the metal coating is relatively thin and may be between and inclusive of 5-30 nm.

The reflective layer may comprise a thermoplastic polymer having excellent electro-insulating properties along with good mechanical strength and thermal resistance. One example may include PET. Thickness of the reflective layer can vary and in one example may be between 0.04 mm-0.08 mm, depending on thickness of the scattering layer. Other thicknesses may also be utilized as can be appreciated by one having skill in the art.

The protective layer preferably comprises a material resistant to tear, oil, and water. The protective layer may be a thermoplastic polymer such as polypropylene or PVC. In one example, the protective layer may be biaxially-oriented polypropylene (BOPP). Other materials may also be utilized. Color of the protective can vary and may be the same to the electronic device the EMF shield is coupled with.

Each of the components of the EMF shield and related system described herein may be manufactured and/or assembled in accordance with the conventional knowledge and level of a person having skill in the art.

While various details, features, combinations are described in the illustrated embodiments, one having skill in the art will appreciate a myriad of possible alternative combinations and arrangements of the features disclosed herein. As such, the descriptions are intended to be enabling only, and non-limiting. Instead, the spirit and scope of the invention is set forth in the appended claims.

First Illustrated Embodiment

Now turning to the drawings, FIG. 1 shows a perspective view of an EMF shield (100) in accordance with a first illustrated embodiment. The EMF shield comprises a plurality of layers, namely, a scattering layer (110), a reflective layer (120), and a protective layer (130). The scattering layer comprises an exterior surface (111) configured to couple with an electronic device, and an interior surface (112) opposite the exterior surface. The interior surface of the scattering layer is coupled to a first side (121) of the reflective layer. A second side (122) opposite the first side is coupled to the protective layer (130). An adhesive coating (140) is disposed on the exterior surface for proper coupling to said electronic device.

The scattering layer (110) comprises a metal coating (113) disposed on the exterior surface (111). The metal coating comprises a thin layer, for example between and inclusive of 3-50 nm. In a preferable embodiment, aluminum is used as the metal coating. Other metals may be utilized. The metal coating may comprise a holographic pattern to aid in scattering an EMF signal. The reflective layer (120) comprises a dielectric material configured to reflect the EMF signal. The EMF shield (100) is configured to scatter and reflect the EMF signal as opposed to purely reflecting or absorbing the signal. Based on position of the scattering layer and the reflective layer, the EMF signal will initially contact the scattering layer prior to contacting the reflective layer. The metal coating initially causes the EMF signal to disperse and scatter. The scattered EMF signal has a lower energy density and therefore becomes less harmful as compared to initial, more concentrated signal.

After the EMF signal is initially scattered by the metal coating (113), the reflective layer (120) causes the EMF signal to reflect. By reflecting the already scattered signal, the EMF signal is more easily broken up. Harmful signals are not sent back to the user or others as is done by conventional reflection shields. Further, harmful signals are not absorbed and retained in near proximity to users as is done by conventional absorption shields. This can be especially dangerous with newer electronics which are designed to be in constant close proximity to a user's head or face such as VR headsets, wireless earbuds, wearable computer glasses, and the like.

The metal coating (113) is an important feature of the EMF shield (100). If the metal coating were not present to initially receive and scatter the EMF signal, the EMF signal will contact the dielectric material of the reflective layer (120) first, causing the EMF signal to undesirably return to the user. An initial scattering of the signal is an important step to the EMF-reduction process. The metal coating may comprise some or all of the scattering layer.

In some embodiments, the scattering layer (110) and the reflective layer (120) are each devoid of any EMF-absorbing materials. In such embodiments devoid of EMF-absorbing material, there is no measurable increase in temperature during use. This ensures all or virtually all of the EMF signals are ultimately being reflected away from the user.

Figure 2:
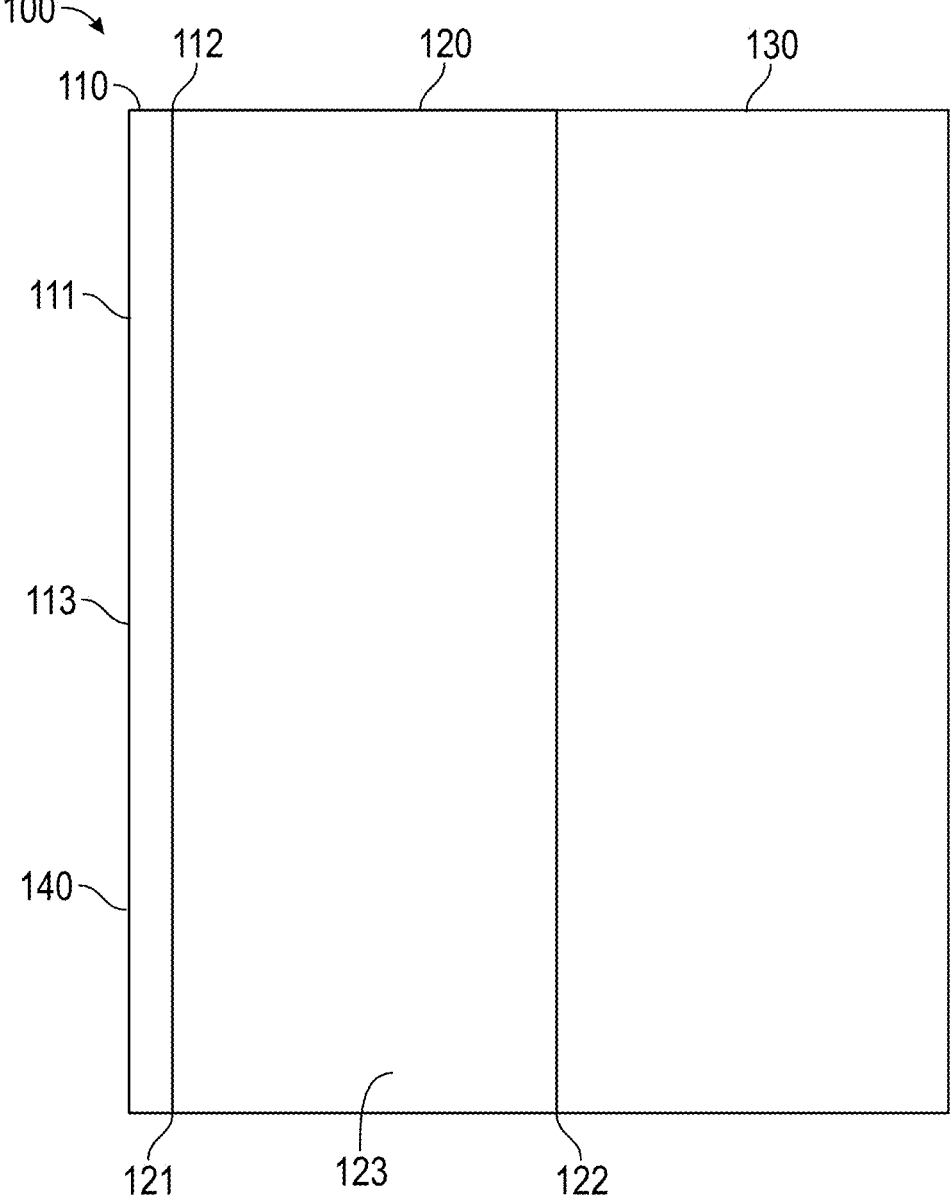
FIG. 2 shows a side view of the EMF shield according to the first illustrated embodiment.

FIG. 2 shows a side view of the EMF shield (100). according to the first illustrated embodiment. The EMF shield comprises a scattering layer (110), a protective layer (130), and a reflective layer (120) disposed therebetween. The scattering layer has an exterior surface (111) and an interior surface (112) opposite the exterior surface. The interior surface is coupled to a first side (121) of the reflective layer by an adhesive or other means of coupling known to one having skill in the art, such as a physical vapor deposition. Disposed on the exterior surface is a metal coating (113). Disposed on the metal coating is an adhesive coating (140) to provide engagement with an electronic device. As shown, all of the scattering layer is the metal coating. In an alternative embodiment, the metal coating comprises a portion of the scattering layer.

The reflective layer (120) comprises a dielectric material (123) having insulative properties to aid in reflection. Materials for the reflective layer may include thermoplastic polymers such as polyethylene terephthalate (PET). Other dielectric materials may also be utilized as can be appreciated by one having skill in the art. Thickness of the reflective layer can vary. Thicknesses between 0.04 mm and 0.08 mm have been shown to provide sufficient reflective properties to significantly reduce the EMF signal. In some embodiments, sufficient thickness is established by having the reflective layer be opaque. If the reflective layer is not thick enough to be opaque, then EMF-reduction is significantly reduced.

The protective layer (130) is coupled to a second side (122) of the reflective layer (120) to provide protective properties to the reflective layer and overall EMF shield (100) such as tear resistance, oil resistance, and water resistance.

Second Illustrated Embodiment

Figure 3:
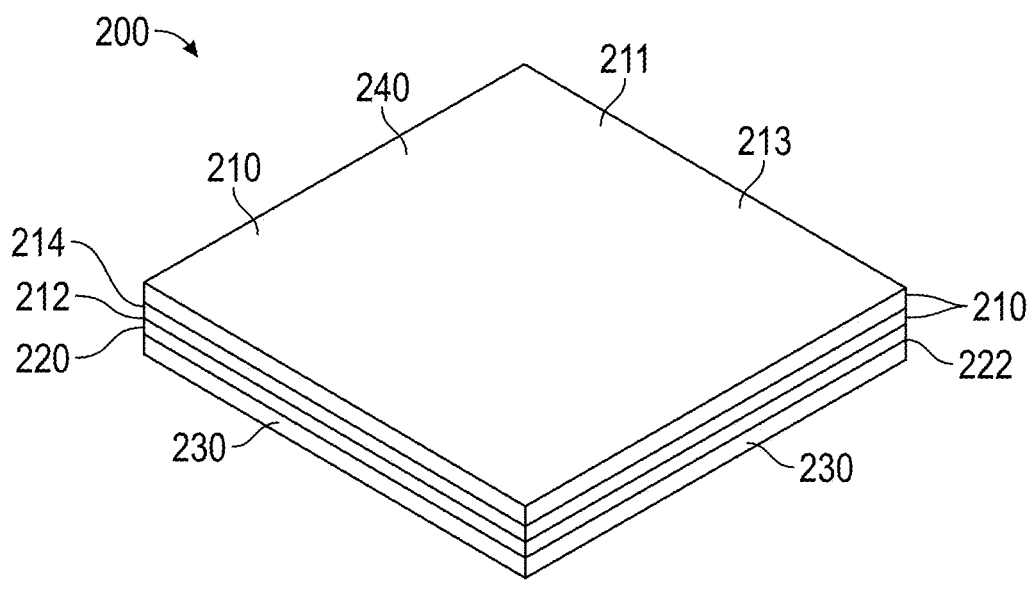
FIG. 3 shows a perspective view of the EMF shield in accordance with a second illustrated embodiment.

FIG. 3 shows a perspective view of the EMF shield (200) in accordance with a second illustrated embodiment. The EMF shield comprises a scattering layer (210) coupled to a reflective (220). The reflective layer is further coupled to a protective layer (230). The scattering layer comprises a dielectric substrate (214) and a metal coating (213) coupled to the dielectric substrate. The metal coating is disposed on an exterior surface (211) of the scattering layer wherein the exterior surface comprises an adhesive coating (240) for coupling to an electronic device. The dielectric substrate is disposed at an interior surface (212) and is coupled to the reflective layer. The reflective layer, along with the dielectric substrate of the scattering layer aid in the reflection process of the EMF shield. An adhesive or other means of engagement is disposed between the scattering layer and the reflective layer, as well as the reflective layer and the protective layer.

The scattering layer (210) having the metal coating (213) disposed on the dielectric substrate (214) allows for the manufacturing process to utilize conventional materials, such as metallized PET. However, unlike conventional metallized PET which is transparent, the scattering layer disclosed herein is opaque to ensure proper EMF-reduction. Increase of the dielectric substrate thickness of the scattering layer can allow for a decreased reduction in thickness of the reflective layer (220). In some embodiments, both the scattering layer and the reflective layer are individually opaque.

Figure 4:
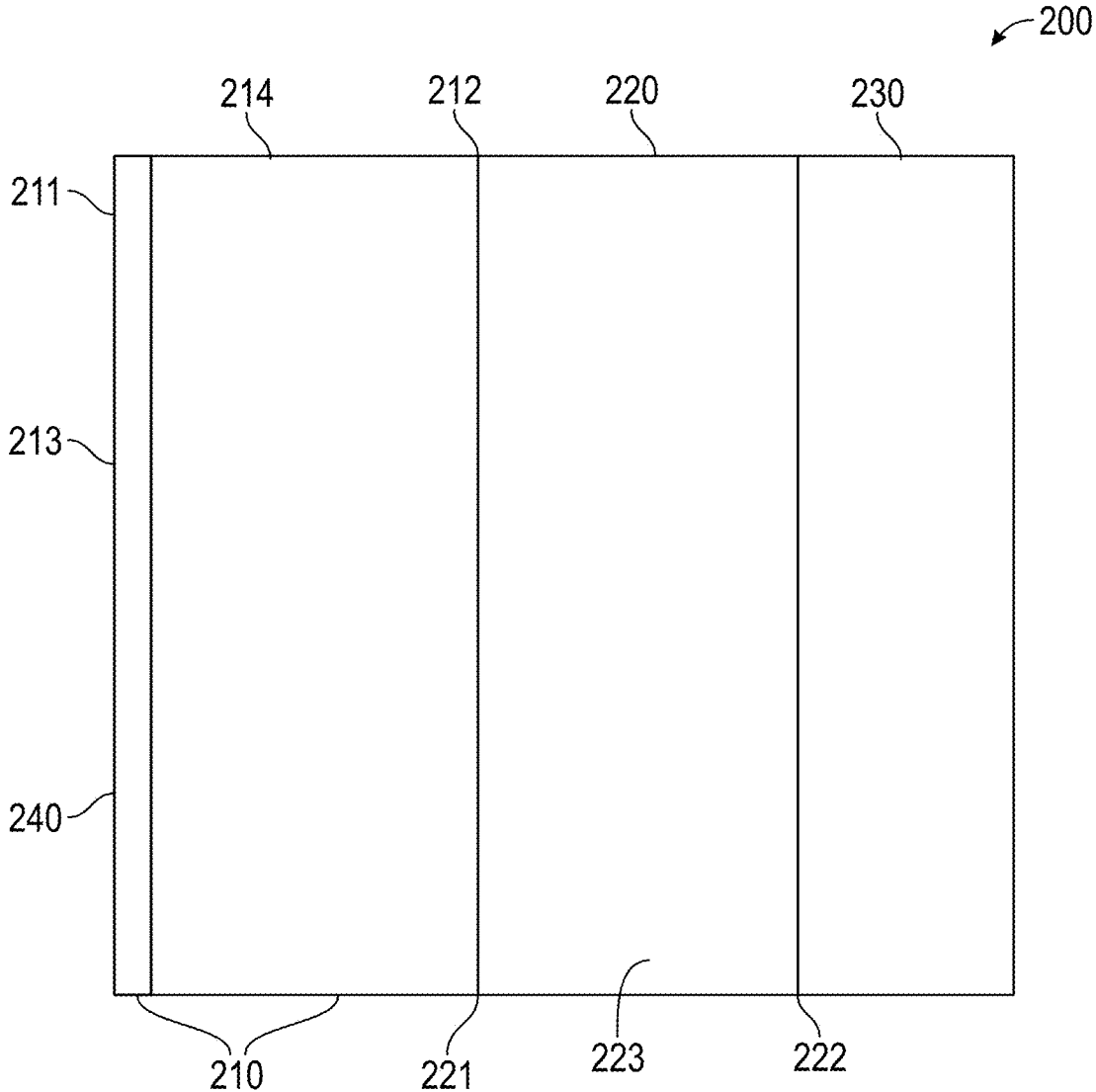
FIG. 4 shows a side view of the EMF shield according to the second illustrated embodiment.
Figures 5A, 5B, 5C, 5D:
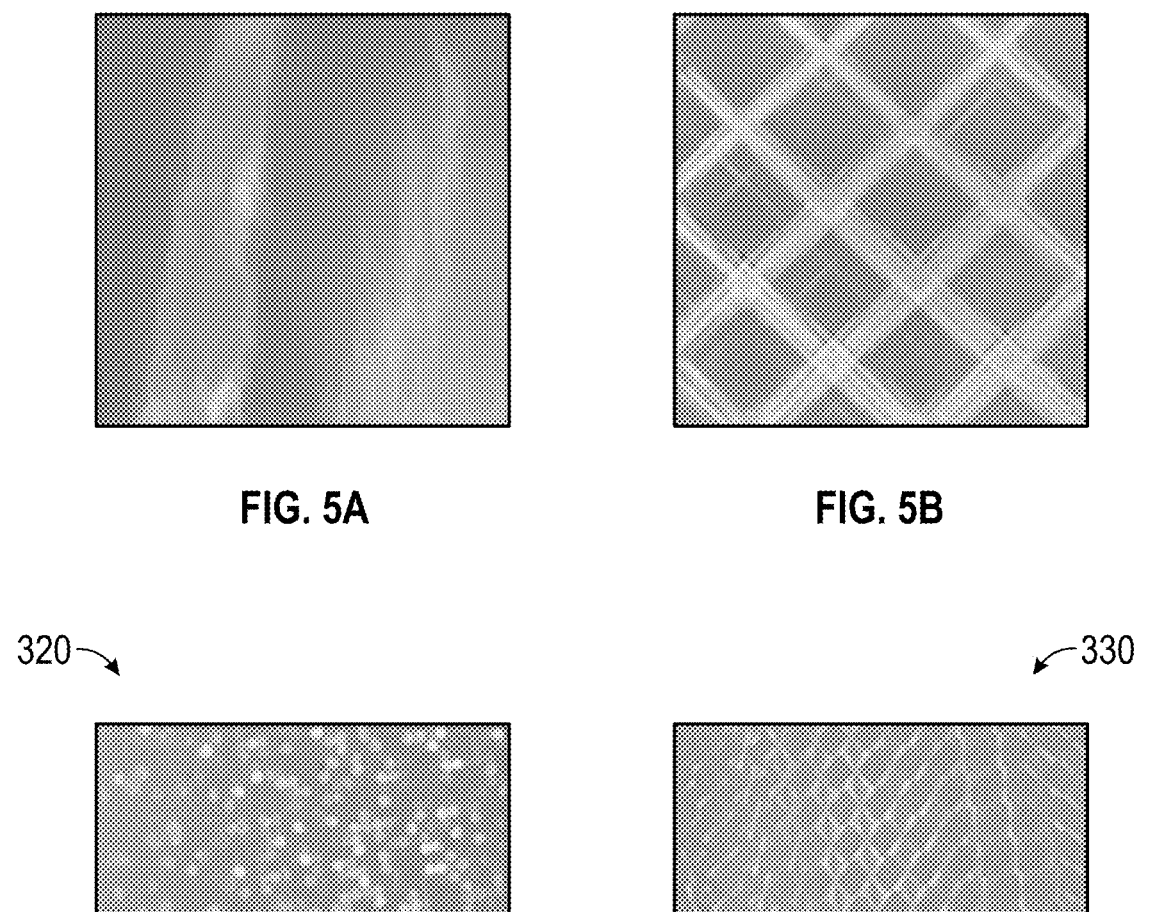
FIG. 5A-5D show various holographic patterns.

FIG. 4 shows a side view of the EMF shield (200) according to the second illustrated embodiment. The EMF shield comprises a reflective layer (220) having a first side (221) and a second side (222) opposite the first side. A scattering layer (210) is coupled to the first side and a protective layer (230) is coupled to the second side. The scattering layer has a metal coating (213) disposed on an exterior surface (211) thereof. The scattering layer further comprises a dielectric substrate (214) such that the dielectric substrate is disposed between the metal coating and the reflective layer. The dielectric substate is coupled to the reflective layer via adhesive or some other means of coupling as can be appreciated by one having skill in the art. The reflective layer comprises a dielectric material (223). In some embodiments, the dielectric material and the dielectric substrate are a same material. In other embodiments, the dielectric material and the dielectric substrate are different materials.

The EMF shield (200) is configured to couple to an electronic device at the exterior surface (211) of the scattering layer (210). The metal coating (213) being disposed on the exterior surface ensures an EMF signal will initially contact the metal coating prior to contacting any insulative materials known to reflect an EMF signal, such as the dielectric substrate (214) or the reflective surface (220). The metal coating comprises an adhesive coating (240) to allow the EMF shield to properly couple to said electronic device.

Position of the metal coating (213) is important for proper EMF-reduction. If the metal coating was disposed at the interior surface (212) of the scattering layer, as opposed to the correct exterior surface (211), the EMF signal would initially contact the dielectric substrate of the scattering layer before it reached the metal coating. The dielectric substrate would reflect most or all of the EMF signal before it could be scattered and dispersed by the metal coating, thereby negatively impacting EMF reduction. In one experiment, the EMF shield (200) was correctly placed on a backside of a tablet and a laptop with a SAR reduction of 61% and 50% respectively. When the EMF shield was reversed such that the EMF signal initially contacted the protective layer (230) and the reflective layer (220), the measured SAR reduction was only 9% and 8%, respectively.

FIG. 5A-5D show various holographic patterns. The metal coating (213) may comprise a holographic pattern to aid in dispersion and scattering of the EMF signal. The various holographic patterns include a first holographic pattern (300), a second holographic pattern (310), a third holographic pattern (320), and a fourth holographic pattern (340). The second holographic pattern is characterized as having a cross-linked pattern. The third holographic pattern is characterized as having a dotted pattern. The fourth holographic pattern is characterized as having a mosaic pattern. The first holographic pattern comprises a prism-style holographic with an even distribution of the metal coating for an even dispersion and scattering of the EMF signal. Preferably, the metal coating of the EMF shield comprises the first holographic pattern to provide an even scattering of the EMF signal similar to visible light being evenly scattered and divided into the visible light's individual colors.

Third Illustrated Embodiment

Figure 6:
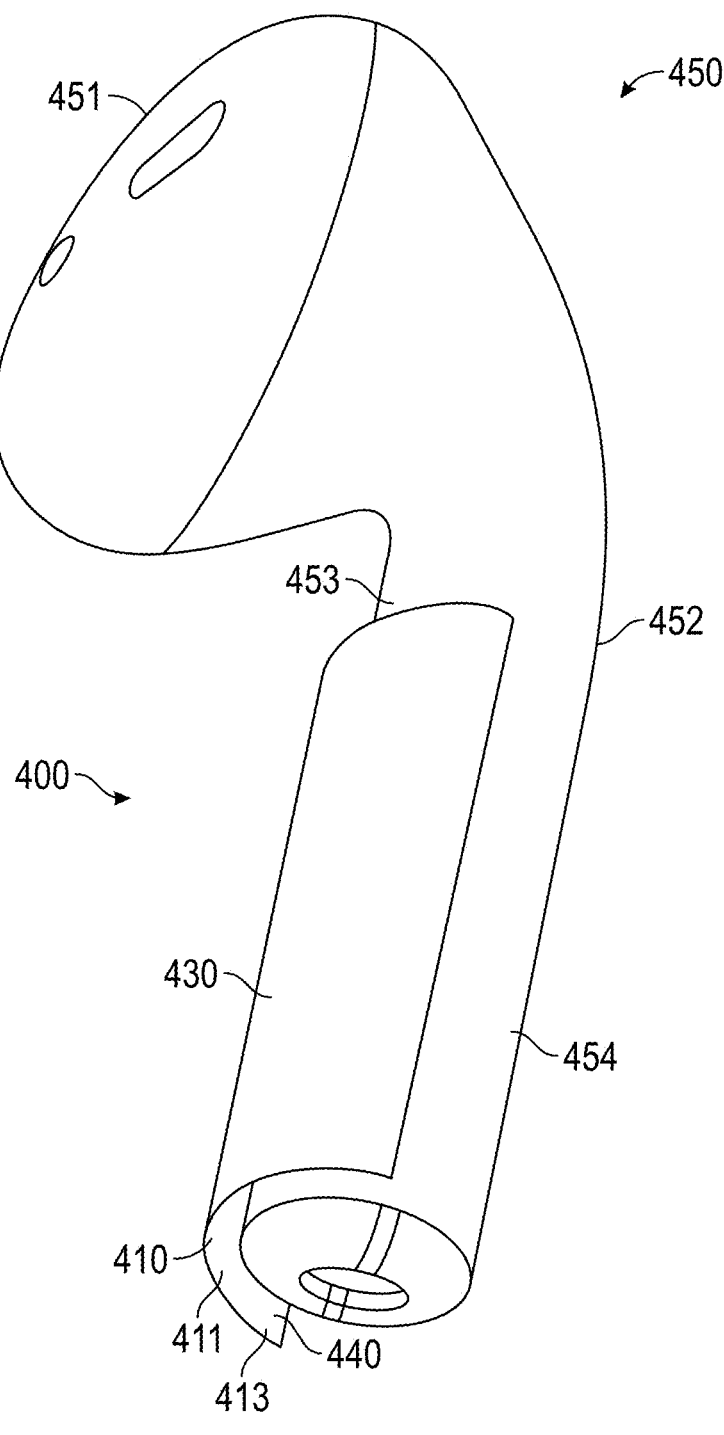
FIG. 6 shows an EMF-reduced system comprising an EMF shield and a wireless earbud in accordance with a third illustrated embodiment.

FIG. 6 shows an EMF-reduced system comprising an EMF shield (400) and a wireless earbud (450) in accordance with a third illustrated embodiment. The wireless earbud comprises an earbud portion (451) coupled to a stem portion (452). The stem portion includes a stem-inner surface (453) and a stem-outer surface (454) opposite the stem-inner surface. When the wireless earbud is worn by a user, the stem-inner surface is configured to face the user's head and may be configured to emit an EMF signal to a secondary wireless earbud worn in the user's other car. The EMF shield is coupled to the wireless earbud at the stem-inner surface. The EMF shield comprises a scattering layer (410), a reflective layer (not shown), and a protective layer (430). The scattering layer comprises a metal coating (413) disposed on an exterior surface (411) thereof, wherein the metal coating comprises an adhesive coating (440) for coupling to the wireless earbud.

In some embodiments, at least a portion of the stem-outer surface (454) is uncovered by the EMF shield (400). If the EMF shield entirely surrounded the stem portion (452) including the stem-inner surface (453) and the stem-outer surface, some of the EMF signal would reflect back to the user's head.

Fourth Illustrated Embodiment

Figure 7:
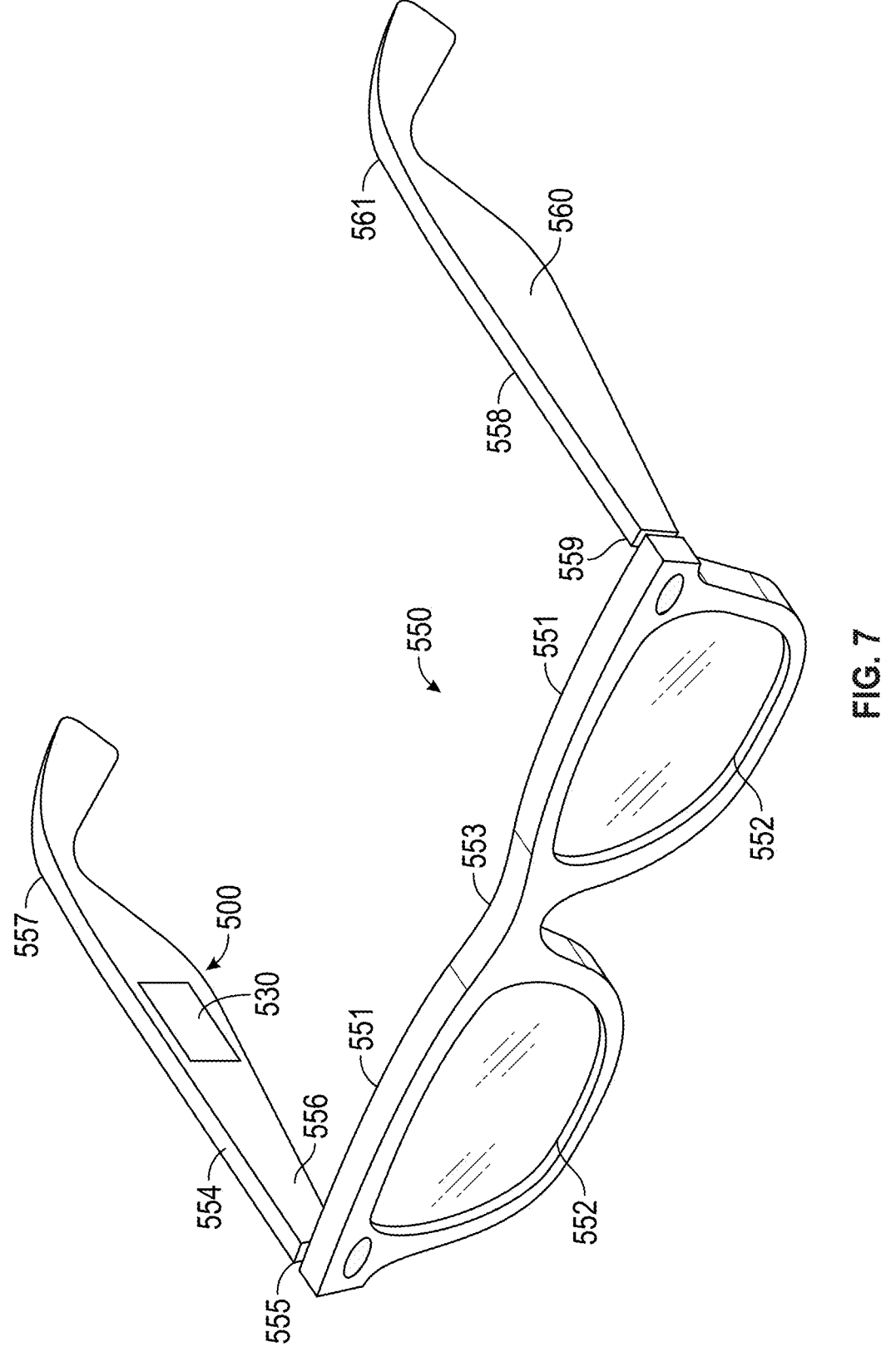
FIG. 7 shows an EMF-reduced system comprising an EMF shield and wearable computer glasses in accordance with a fourth illustrated embodiment.

FIG. 7 shows an EMF-reduced system comprising an EMF shield (500) and wearable computer glasses (550) in accordance with a fourth illustrated embodiment. The wearable computer glasses comprise a rim (551) with lens (552) coupled thereto along with a bridge (553) disposed between each of the lens. A first temple (554) is hingedly coupled to the rim at a first end piece (555). The first temple comprises a first inner side (556), a first outer side (not shown), and a first temple tip (557). A second temple (558) is hingedly coupled to the rim at a second end piece (559). The second temple comprises a second inner side (not shown), a second outer side (560), and a second temple tip (561). The EMF shield is coupled to the wearable computer glasses at the inner side of the first temple between the first temple tip and the first end piece. Preferably, the EMF shield is positioned at the first inner side prior to the where the first temple begins to taper due to the first temple tip.

In other embodiments, the EMF shield (500) is disposed at the second inner side of the second temple (558). In yet other embodiments, the EMF shield is coupled to both the first temple (554) and the second temple (558) at the first inner side (556) and the second inner side, respectively.

Fourth Illustrated Embodiment

Figure 8:
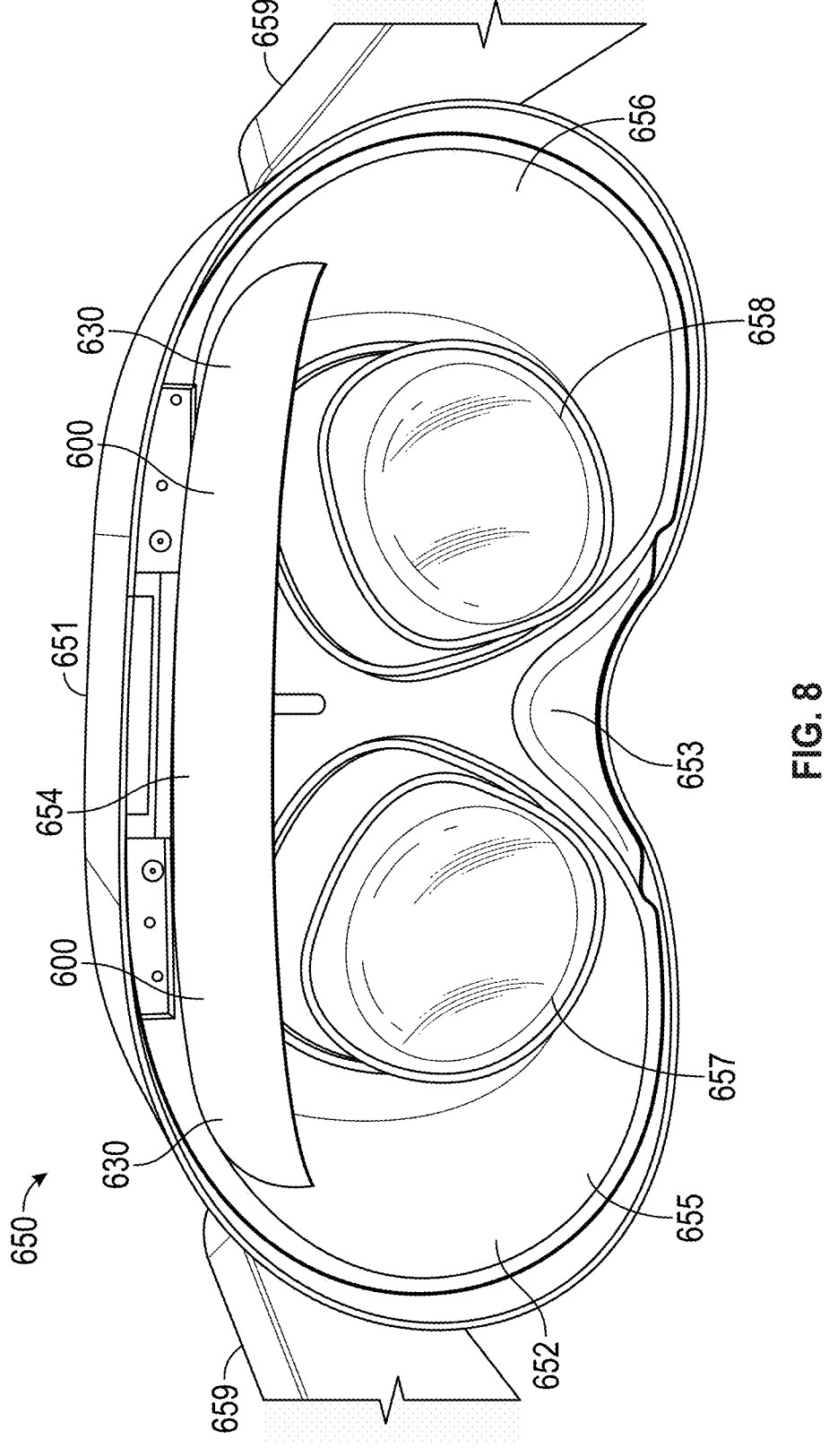
FIG. 8 shows an EMF-reduced system comprising an EMF shield and a virtual reality (VR) headset in accordance with a fifth illustrated embodiment.

FIG. 8 shows an EMF-reduced system comprising an EMF shield (600) and a virtual reality (VR) headset (650) in accordance with a fifth illustrated embodiment. The VR headset comprises a housing (651) having a facial-interfacing surface (652). The facial-interfacing surface includes a first lens (657) and a second lens (658). Disposed above the first and second lens is a forehead portion (654) configured to contact a user's forehead. A nose portion (653) is disposed between the first and second lens wherein the nose portion is configured to contact the user's nose. A first temple portion (655) and a second temple portion (656) are positioned on a side of the first and second lens, respectively, and are each configured to position adjacent to the user's temples while caring the VR headset. A headband (659) is coupled to the housing. The EMF shield is coupled to the housing (651) at the forehead portion. In some embodiments, the EMF shield extends laterally beyond both the first lens and the second lens. The EMF shield may comprise a single piece or may comprise a plurality of pieces to confirm to the curvature of the facial-interfacing surface.

Feature List

EMF shield (100; 200; 400; 500; 600)
scattering layer (110; 210; 410)

exterior surface (111; 211; 411)
interior surface (112; 212)
metal coating (113; 213; 413)
dielectric substrate (214)
reflective layer (120; 220)
first side (121; 221)
second side (122; 222)
dielectric material (123; 223)
protective layer (130; 230; 430; 530; 630)
adhesive coating (140; 240; 440)
first holographic pattern (300)
second holographic pattern (310)
third holographic pattern (320)
fourth holographic pattern (330)
wireless earbud (450)
earbud portion (451)
stem portion (452)
stem-inner surface (453)
stem-outer surface (454)
wearable computer glasses (550)
rim (551)
lens (552)
bridge (553)
first temple (554)
first end piece (555)
first inner side (556)
first temple tip (557)
second temple (558)
second end piece (559)
second outer side (560)
second temple tip (561)
virtual reality headset (650)
housing (651)
facial-interfacing surface (652)
nose portion (653)
forehead portion (654)
first temple portion (655)
second temple portion (656)
first lens (657)
second lens (658)
headband (659)

What is claimed is:

1. An EMF shield configured to interact with an EMF signal, comprising:

a scattering layer having an exterior surface and an interior surface opposite the exterior surface, the scattering layer further comprising a metal layer comprising each portion of the scattering layer, wherein the metal layer comprises a thickness between and inclusive of 5-30 nm; and an insulator layer having a first side and a second side opposite the first side, the first side of the insulator layer coupled to the interior surface of the scattering layer to form a reflective boundary, wherein the reflective boundary is configured to reflect the EMF signal, the insulator layer comprising an impedance greater than the scattering layer;

an adhesive coating disposed on the exterior side;

wherein the scattering layer is configured to scatter and disperse a portion of the EMF signal and further configured to transmit another portion of the EMF signal through the scattering layer, and further wherein the scattering layer is configured to attach to an electronic device such that the scattering layer is configured to be disposed between the insulator layer and the electronic device.

2. The EMF shield of claim 1, wherein the scattering layer is characterized as opaque and is configured to block visible light.

3. The EMF shield of claim 1, the metal layer further comprising a holographic pattern.

4. An EMF shield configured to interact with an EMF signal, comprising:

a scattering layer having an exterior surface and an interior surface opposite the exterior surface, the exterior side configured to attach to an electronic device, the scattering layer further comprising a metal layer; and an insulator layer having a first side and a second side opposite the first side, the first side of the insulator layer coupled to the interior surface of the scattering layer to form a reflective boundary, wherein the reflective boundary is configured to reflect the EMF signal.

5. The EMF shield of claim 4, wherein the scattering layer is configured to scatter and disperse a portion of the EMF signal and further configured to transmit another portion of the EMF signal through the scattering layer.

6. The EMF shield of claim 4, wherein the metal layer is disposed at the exterior surface of the scattering layer.

7. The EMF shield of claim 4, the metal layer further comprising a holographic pattern.

8. The EMF shield of claim 4, the metal layer further comprising aluminum.

9. The EMF shield of claim 4, wherein each portion of the scattering layer comprises the metal layer.

10. The EMF shield of claim 4, wherein the metal layer comprises a thickness between and inclusive of 5-30 nm.

11. The EMF shield of claim 4, wherein the scattering layer comprises a thickness between and inclusive of 5-30 nm.

12. The EMF shield of claim 4, the scattering layer further comprising a secondary insulator coupled to the second side thereby forming a dielectric boundary therebetween.

13. The EMF shield of claim 4, wherein the EMF shield comprises metallized polyethylene terephthalate.

14. The EMF shield of claim 4, further comprising a protective layer coupled to the second side of the insulator layer, wherein the protective layer comprises a thermoplastic polymer.

15. The EMF shield of claim 4, wherein the scattering layer and the insulator layer are each devoid of EMF-absorbing material.

16. The EMF shield of claim 4, the scattering layer further comprising adhesive coating disposed on the exterior side.

17. The EMF shield of claim 4, wherein the EMF shield is coupled to an electronic device such that the scattering layer is disposed between the electronic device and the reflective boundary.

18. The EMF shield of claim 4, the insulator layer further comprising a dielectric material.

19. The EMF shield of claim 4, wherein the insulator layer comprises an impedance greater than the scattering layer.

20. The EMF shield of claim 4, wherein the scattering layer is characterized as opaque and is configured to block visible light.

* * * * *